United States Patent [19]

Ye et al.

[11] Patent Number: 5,474,640
[45] Date of Patent: Dec. 12, 1995

[54] APPARATUS FOR MARKING A SUBSTRATE USING IONIZED GAS

[75] Inventors: Yan Ye, Cupertio; Anand Gupta, San Jose; Yuri Uritsky, Foster City, all of Calif.

[73] Assignee: Applied Materials, Inc., Santa Clara, Calif.

[21] Appl. No.: 94,653

[22] Filed: Jul. 19, 1993

[51] Int. Cl.$^6$ ..................................................... C23F 1/02
[52] U.S. Cl. ............................................ 156/345; 216/71
[58] Field of Search ................................. 156/345, 625, 156/643, 646, 654, 658; 204/129.1

[56] References Cited

U.S. PATENT DOCUMENTS

| | | |
|---|---|---|
| 3,428,872 | 2/1969 | Yoshida et al. . |
| 3,583,561 | 6/1971 | Wiesler et al. . |
| 3,783,044 | 1/1974 | Cheskis et al. . |
| 4,316,093 | 2/1982 | Broers et al. ................... 250/492.1 |
| 4,343,993 | 8/1982 | Binnig et al. ................... 250/306 |
| 4,348,803 | 9/1982 | Sasaki . |
| 4,382,186 | 5/1983 | Denholm et al. ................ 250/492.2 |
| 4,418,467 | 12/1983 | Iwai . |
| 4,550,257 | 10/1985 | Binnig et al. ................... 250/492.2 |
| 4,569,743 | 2/1986 | Bayer et al. . |
| 4,610,774 | 9/1986 | Sakata et al. . |
| 4,724,318 | 2/1988 | Binnig . |
| 4,785,189 | 11/1988 | Wells ............................. 250/492.2 |
| 4,851,097 | 7/1989 | Hattori et al. ..................... 156/345 |
| 4,874,459 | 10/1989 | Coldren et al. ................... 156/345 |
| 4,981,529 | 1/1990 | Tsujita . |
| 5,047,649 | 9/1991 | Hodgson et al. ................. 250/492.2 |
| 5,062,364 | 11/1991 | Lewis et al. ...................... 101/467 |
| 5,081,353 | 1/1992 | Yamada et al. . |
| 5,086,015 | 2/1992 | Itoh et al. . |
| 5,091,052 | 2/1992 | Nowak et al. ..................... 156/345 |
| 5,128,280 | 7/1992 | Matsumoto et al. . |
| 5,149,404 | 9/1992 | Blonder et al. ................... 204/129.1 |
| 5,157,003 | 10/1992 | Tsuji et al. . |

Primary Examiner—Olik Chaudhuri
Assistant Examiner—Long Pham
Attorney, Agent, or Firm—Ashok K. Janah; Peter J. Sgarbossa

[57] ABSTRACT

An apparatus suitable for marking a substrate comprises a holder for holding a substrate and a ground for electrically grounding the substrate. At least one needle electrode has a tip located proximate to the substrate so that there is a gap between the substrate and the tip. A high voltage source provides a current to the electrode tip to ionize the gas in the gap so that the ionized gas can impinge upon and mark the substrate.

15 Claims, 1 Drawing Sheet

APPARATUS FOR MARKING A SUBSTRATE USING IONIZED GAS

BACKGROUND

The present invention relates to an apparatus and method for producing marks, such as reference marks, on substrates.

Reference marks are applied on semiconductor substrates to allow precise positioning of the substrate in fabrication and inspection processes. In one inspection method, a light scattering surface inspection system is used to locate contaminant particles on the surface of the wafer. The contaminant particles are then assigned coordinates based on a reference grid which is established using the reference marks on the wafer. The wafer is then placed in a scanning electron microscope ("SEM"), and the reference marks on the wafer used to locate the coordinates of the contaminant particles on the wafer.

In such inspection processes, the reference marks on the wafer must be small. Small marks allow faster location of the coordinates for the contaminant particles in the SEM. Without fine marks, it takes an inordinate amount of time to locate the contaminant particles on the wafer. To be effective, the reference marks should be sized smaller than about 100 microns, and preferably sized from about 1 micron to about 60 microns.

It is difficult to create such fine reference marks. Mechanical scratching processes that use a sharp needle to scratch the surface of the wafer cause unacceptably large marks, which can increase the possibility of cracking the thin wafers. Typical laser etching processes have coarse optic systems that produce marks having sizes greater than about 100 microns, and laser etching processes with fine optic systems are expensive.

Further, current wafer marking processes often damage the region of the wafer surrounding the mark. For example, laser etching can "burn" the region surrounding the mark. Existing processes can also create contaminants that subsequently deposit on the regions of the wafer that surround the reference mark. These contaminants substantially decrease the yield of integrated circuit chips formed from the semiconductor wafer.

Thus, it is desirable to have a marking apparatus and process that can produce fine reference marks on substrates, without cracking the substrate, without damaging the surrounding regions, and without depositing contaminant particles on the substrate.

SUMMARY

The present apparatus and method satisfy these needs. An apparatus suitable for practicing the present invention comprises a holder for holding a substrate and a ground for electrically grounding the substrate. At least one needle electrode has a tip proximate to and spaced apart from the holder, so that when a substrate is held by the holder, the electrode tip and the substrate define a gap therebetween. A high voltage source provides a current to the electrode tip to ionize the gas in the gap so that the ionized gas can impinge upon and mark the substrate.

The ground can contact and electrically ground the holder. Alternatively, the ground can comprise an electrically grounded pin that can contact and ground the substrate, through a hole in the substrate holder.

Preferably, the marking apparatus further comprises a gas delivery system to provide gas to the gap at a sufficiently high pressure to blow away contaminants formed by the marking process.

A process for marking a substrate comprises the steps of: (a) placing the tip of at least one needle electrode proximate to a substrate, so that there is a gap between the electrode tip and the substrate, the gap having a gas therein; (b) electrically biasing the electrode with respect to the substrate, preferably electrically grounding the substrate and applying a high voltage to the electrode; and (c) passing a current having a sufficiently high voltage through the electrode tip to ionize the gas in the gap so that the ionized gas impinges upon and marks the substrate.

DRAWINGS

These and other features, aspects, and advantages of the present invention will become better understood from the following drawings, description and claims, where:

FIG. 1b shows a schematic of another version of the marking apparatus of FIG. 1a.

DESCRIPTION

Figure 1A:
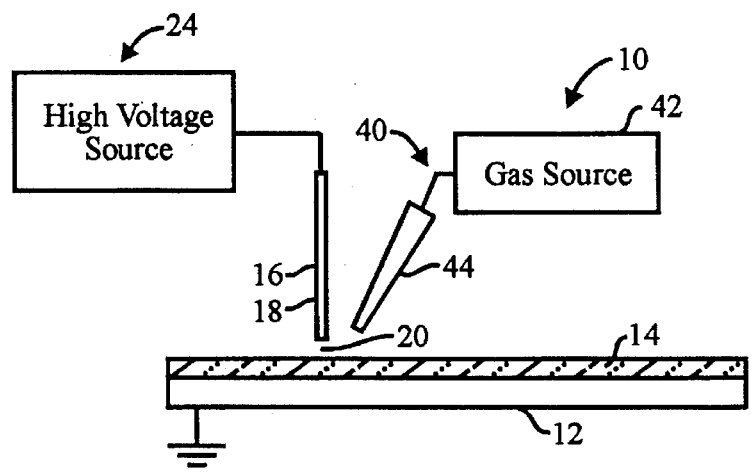
FIG. 1a shows a schematic of a marking apparatus of the present invention.

The present invention provides an apparatus and process for marking substrates, such as semiconducting wafers. With reference to FIG. 1a, the apparatus 10 comprises a holder 12 for holding a substrate 14 and a ground 15 for electrically grounding the substrate. At least one needle electrode 16 has a tip 18 located proximate to and spaced apart from the substrate 14, so that when a substrate 14 is held by the holder 12, the electrode tip 18 and the substrate 14 define a gap 20 therebetween. A high voltage source 24 provides a high voltage current to the electrode tip 18 for ionizing the gas in the gap 20 so that the ionized gas can impinge upon and mark the substrate 14.

Figure 1B:
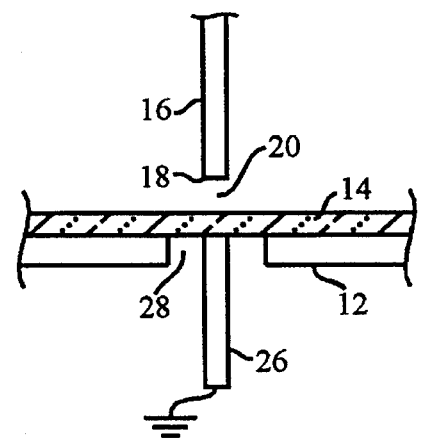

The electrical ground 15 can contact the holder 12 so that the holder 12 is electrically grounded. Alternatively, the ground 15 can comprise an electrically grounded pin 26 that contacts the substrate 14 adjacent to the needle electrode tip 18. The pin 26 can contact the substrate 14 via a hole 28 within the holder 12, as shown in FIG. 1b, which allows electrons from the ionized gas to flow through the substrate 14 and to the grounded pin 26.

The apparatus 10 can comprise a single needle electrode 16 for producing a single reference mark at a time, or can comprise a plurality of needle electrodes 16 so that multiple marks can simultaneously be formed on the substrate 14. The multiple electrode apparatus can further comprise a plurality of electrically grounded pins 26, each of the pins 26 contacting the substrate 14 adjacent to an electrode tip 18.

The gas in the gap 20 can be an ambient gas that is present in the gap, such as air, or gas can be delivered to the gap via a gas delivery system 40. Preferably, the gas delivery system 40 comprises a gas source 42 providing gas to a nozzle 44 that directs the gas to the gap 20 at a sufficiently high pressure to blow away contaminants formed by the marking process.

The gas can be a nonreactive or inert gas such as Ar, Xe, or He. Xe is preferred because the large Xe molecule is more effective in sputtering and marking the substrate. The gas can also be a reactive gas such as $O_2$, $O_3$, $F_2$, $Cl_2$, $Br_2$, $BCl_3$, $SF_6$, $CF_4$, or $C_2F_6$, which can etch the substrate.

When a pressurized gas is introduced into the gap 20 via the nozzle 44, the gas is typically flowed at a volumetric flow rate of from about 10 sccm to about 10,000 sccm, and more typically flowed at a rate of from about 100 sccm to about 5,000 sccm.

To mark the substrate 14, the substrate 14 is placed in the holder 12 and grounded by the electrical ground 15. Current provided by the high voltage source 24 is passed through the electrode tip 18. The current ionizes the gas in the gap 20 so that the ionized gas impinges upon and marks the grounded substrate 14. The substrate 14 is sputtered or etched until a mark forms on the substrate. Typically, the substrate is sputtered or etched for at least about 5 seconds.

The electrode voltage necessary to ionize the gas in the gap 20 depends upon the size of the gap 20 and the type of gas. As the size of the gap 20 increases or as the ionization potential of the gas increases, the voltage necessary to ionize the gas increases. Preferably, the width of the gap 20 between the electrode tip 18 and the substrate 14 is less than about 100 millimeters, more preferably the width is less than about 10 millimeters, and most preferably the width is from about 1 to about 6 millimeters. For such gap distances, the voltage is typically from about 1000 volts to about 10,000 volts, and more typically from about 2000 volts to about 6000 volts.

Typically, a direct current from about 1 microamp to about 50 microamps is used, and more typically the current is from about 1 microamp to about 10 microamps. The current can be also be pulsed at a frequency of about 10 Hz.

Figure 2:
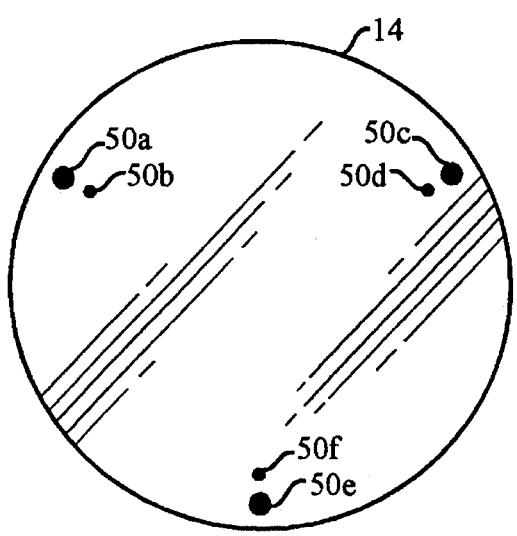
FIG. 2 shows a substrate that is marked using the apparatus of FIG. 1.

Preferably, the substrate 14 is marked with a plurality of symmetrically positioned marks 50 as shown in FIG. 2. The symmetrical reference marks allow precise alignment of the substrate 14 in processing and inspecting apparatus.

EXAMPLE 1

A silicon wafer 14, having a thickness of about 0.73 mm and a diameter of about 200 mm (8 inches), was placed in a holder 12 that was electrically grounded by the ground 15. The needle electrode tip 18 was positioned at the center of the wafer, and the high voltage source 24 was set to provide a voltage of 2000 volts to the electrode 16. The high voltage source 24 provided a DC current of about 5 microamps that was pulsed at a frequency of 10 Hz.

The gas in the gap 20 was ambient air. The gap 20 was gradually decreased by moving the electrode tip 18 toward the substrate 14, until the air in the gap 20 ionized at a gap distance of about 3 millimeters. A mark 50 was sputtered on the substrate 14 in about 5 seconds.

The mark 50 formed on the wafer 14 was determined by SEM examination to be circular in shape with a diameter ranging from about 1 to about 5 microns. There was no visible damage to the wafer in regions adjacent to the mark 50.

EXAMPLE 2

A silicon wafer 14 similar to the wafer described above, was placed in a holder 12 having a hole 28 therethrough. The needle electrode tip 18 was positioned above the hole 28, and a grounded pin 26 was inserted through the hole 28 and contacted with the wafer 14 at a region adjacent to the electrode tip 18. The high voltage source 24 was set to provide a 10 Hz pulsed voltage of 5000 volts, with a current ranging from about 3 to about 7 microamps.

Ambient air provided the gas in the gap 20. The gap 20 was gradually decreased, until at about 3 millimeters, the air within the gap ionized and sputtered the substrate 14. After about 5 seconds a mark 50 was sputtered on the substrate 14. The mark 50 was determined by SEM examination to be circular in shape with a diameter ranging from about 1 to about 5 microns. No damage was visible in adjacent regions.

The present invention has been described in considerable detail with reference to certain preferred versions thereof, however, other versions are possible. For instance, the holder may be held at a DC potential other than zero and still effectively act as a ground. Indeed, it is possible to ground the electrode and apply the high voltage to the holder or wafer. Further, more complex electrical waveforms may be applied between the wafer and the electrode as long as the gas is ionized to promote the sputtering of marks into the wafer. Therefore, the spirit and scope of the appended claims should not be limited to the description of the preferred versions contained herein.

What is claimed is:

1. An apparatus for marking a substrate, the apparatus comprising:

(a) a holder for holding a substrate;

(b) a ground for electrically grounding the substrate;

(c) at least one needle electrode having a tip located proximate to and spaced apart from the holder, so that when a substrate is held by the holder, the electrode tip and the substrate define a gap therebetween; and (d) a high voltage source for providing a current to the electrode tip for ionizing the gas in the gap so that the ionized gas can impinge upon and mark the substrate, substantially without depositing material on the substrate.

2. The apparatus of claim 1, wherein the ground contacts and electrically grounds the holder.

3. The apparatus of claim 1, wherein the holder has a hole therethrough, and wherein the ground comprises an electrically grounded pin that can contact the substrate through the hole in the holder.

4. The apparatus of claim 1, comprising a plurality of the needle electrodes for simultaneously forming multiple marks on the substrate.

5. The apparatus of claim 1, further comprising a gas delivery system for providing gas to the gap.

6. The apparatus of claim 5, wherein the gas delivery system can provide gas at a sufficiently high pressure to blow away contaminants formed by the marking process.

7. The apparatus of claim 6, wherein the gas delivery system comprises a nozzle that directs the gas into the gap.

8. The apparatus of claim 1, wherein the gap has a width of less than about 100 millimeters.

9. The apparatus of claim 8, wherein the gap has a width of less than about 10 millimeters.

10. The apparatus of claim 1, wherein the high voltage source can provide a voltage of from about 1000 volts to about 10,000 volts.

11. The apparatus of claim 10, wherein the high voltage source can provide a voltage of from about 2000 volts to about 6000 volts.

12. The apparatus of claim 10, wherein the high voltage source can provide a current of from about 1 microamp to about 50 microamps.

13. The apparatus of claim 12, wherein the high voltage source provides a current of from about 1 microamp to about 10 microamps.

14. The apparatus of claim 1, wherein the ionized gas impinges upon and marks the substrate by sputtering or etching the substrate.

15. The apparatus of claim 1, wherein the gap has a width of from about 1 to about 100 mm.

* * * * *